(12) United States Patent
Izawa et al.

(10) Patent No.: US 10,894,901 B2
(45) Date of Patent: Jan. 19, 2021

(54) METHOD FOR PRODUCING POLISHING COMPOSITION AND POLISHING METHOD

(71) Applicant: FUJIMI INCORPORATED, Kiyosu (JP)

(72) Inventors: Yoshihiro Izawa, Kiyosu (JP); Shota Suzuki, Kiyosu (JP)

(73) Assignee: FUJIMI INCORPORATED, Kiyosu (JP)

(*) Notice: Subject to any disclaimer, the term of this patent is extended or adjusted under 35 U.S.C. 154(b) by 0 days.

(21) Appl. No.: 16/317,448

(22) PCT Filed: Jun. 12, 2017

(86) PCT No.: PCT/JP2017/021694
§ 371 (c)(1),
(2) Date: Jan. 11, 2019

(87) PCT Pub. No.: WO2018/012175
PCT Pub. Date: Jan. 18, 2018

(65) Prior Publication Data
US 2019/0300751 A1    Oct. 3, 2019

(30) Foreign Application Priority Data

Jul. 15, 2016  (JP) .................... 2016-140568

(51) Int. Cl.
*C09G 1/02* (2006.01)
*C09K 3/14* (2006.01)
(Continued)

(52) U.S. Cl.
CPC ............ *C09G 1/02* (2013.01); *B24B 37/00* (2013.01); *C09K 3/14* (2013.01); *H01L 21/304* (2013.01);
(Continued)

(58) Field of Classification Search
None
See application file for complete search history.

(56) References Cited

U.S. PATENT DOCUMENTS

| 5,759,917 A | 6/1998 | Grover et al. |
| 9,012,327 B2 | 4/2015 | Guo |

(Continued)

FOREIGN PATENT DOCUMENTS

| JP | 2001-507739 A | 6/2001 |
| JP | 2007-153732 A | 6/2007 |

(Continued)

OTHER PUBLICATIONS

Office Action issued in corresponding Taiwanese Application No. 106122072 dated Oct. 28, 2020 with English translation.

*Primary Examiner* — Allan W. Olsen
(74) *Attorney, Agent, or Firm* — Foley & Lardner LLP

(57) ABSTRACT

The present invention provides a method for producing a polishing composition which can polish an object to be polished at a high polishing speed and with fewer scratches (defects).

The present invention is a method for producing a polishing composition, the method including: preparing silica in which an intensity of a peak of a silica four-membered ring structure and an intensity of a peak derived from a silica random network structure when analyzed by Raman spectroscopy satisfy a predetermined requirement; and mixing the silica with a dispersing medium.

8 Claims, 1 Drawing Sheet

(51) Int. Cl.
*H01L 21/304* (2006.01)
*B24B 37/00* (2012.01)
*H01L 21/306* (2006.01)

(52) U.S. Cl.
CPC ...... *C09K 3/1409* (2013.01); *H01L 21/30625* (2013.01)

(56) References Cited

U.S. PATENT DOCUMENTS

| | | |
|---|---|---|
| 9,803,109 B2 * | 10/2017 | Huang ..................... C09D 1/02 |
| 2012/0094491 A1 | 4/2012 | Kanamaru et al. |
| 2013/0092871 A1 | 4/2013 | Sekiguchi et al. |
| 2016/0152504 A1 * | 6/2016 | Ono ........................ C03B 25/02 65/117 |
| 2017/0241863 A1 * | 8/2017 | Borrelli .............. G01M 11/0285 |
| 2018/0100107 A1 * | 4/2018 | Alhooshani .......... B01J 29/0308 |

FOREIGN PATENT DOCUMENTS

| | | |
|---|---|---|
| JP | 2015-063687 A | 4/2015 |
| WO | WO-2011-021599 A1 | 2/2011 |
| WO | WO-2011-162265 A1 | 12/2011 |

* cited by examiner

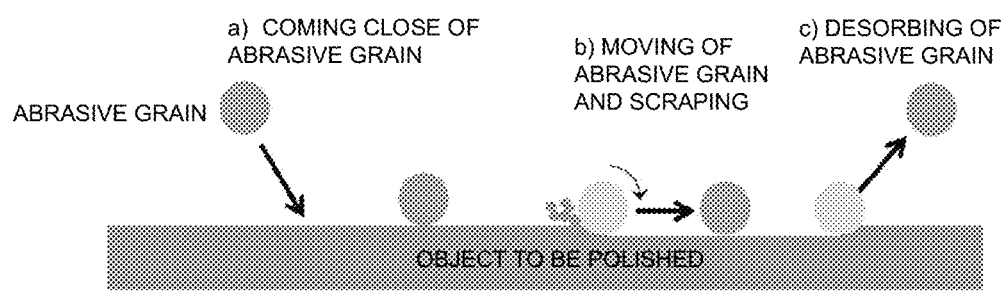

METHOD FOR PRODUCING POLISHING COMPOSITION AND POLISHING METHOD

CROSS-REFERENCE TO RELATED APPLICATIONS

This application is a National Phase of International Patent Application No. PCT/JP2017/021694 filed on Jun. 12, 2017, which claims priority to Japanese Patent Application No. 2016-140568 filed on Jul. 15, 2016. The contents of these applications are herein incorporated by reference in their entirety.

TECHNICAL FIELD

The present invention relates to a method for producing a polishing composition and a polishing method.

BACKGROUND ART

In recent years, a so-called chemical mechanical polishing (CMP) technique for polishing and flattening a semiconductor substrate in producing a device is used, in accordance with multilayer wiring on a surface of a semiconductor substrate. CMP is a method for flattening a surface of an object to be polished (polishing object) such as a semiconductor substrate by using a polishing composition (slurry) containing abrasive grains such as silica, alumina, or ceria, an anti-corrosion agent, a surfactant, or the like. The object to be polished (polishing object) is silicon, polysilicon, silicon oxide film (silicon oxide), silicon nitride, a wiring or a plug which consists of metal, or the like.

As a CMP slurry for polishing a substrate containing oxygen atoms and silicon atoms such as silicon oxide, for example, JP 2001-507739 W (the specification of US 2004/089634 A) discloses an aqueous chemical mechanical polishing composition containing a salt, a soluble cerium, carboxylic acid, and silica (particularly fumed silica). Further, JP 2015-063687 A (the specification of US 2015/079788 A) discloses a chemical mechanical polishing composition containing water, 0.1 to 40% by weight of colloidal silica particles, and 0.001 to 5% by weight of an additive (pyridine derivative).

SUMMARY OF INVENTION

However, there is a problem in that, although the aqueous chemical mechanical polishing composition described in JP 2001-507739 W (the specification of US 2004/089634 A) improves a polishing speed of a substrate, many scratches are generated on a surface of the substrate.

Further, there is a problem in that, although the chemical mechanical polishing composition described in JP 2015-063687 A (the specification of US 2015/079788 A) suppresses scratches on a surface of a substrate, a polishing speed is not sufficient.

As described above, regarding polishing an object to be polished containing oxygen atoms and silicon atoms, a polishing composition that can solve the problem which are improving the polishing speed and reducing the scratches (defects), which contradict each other, has been desired.

The present invention has been made in view of the above-described circumstances, and an object thereof is to provide a method for producing a polishing composition which can polish an object to be polished (particularly, an object to be polished containing oxygen atoms and silicon atoms) at a high polishing speed and can reduce scratches (defects) on a surface of the object to be polished.

The present inventors have conducted intensive studies to solve the above-described problems. As a result, the present inventors have found that the above-described problems are solved by a method for producing a polishing composition, the method including: preparing silica in which an intensity of a peak derived from a silica four-membered ring structure and an intensity of a peak derived from a silica random network structure when analyzed by Raman spectroscopy satisfy a predetermined requirement; and mixing the silica with a dispersing medium.

That is, the above-described object can be achieved by a method for producing a polishing composition, the method including: preparing silica satisfying the following Condition 1 when analyzed by Raman spectroscopy; and mixing the silica with a dispersing medium,

[Mathematical Formula 1]

$$I(490\ cm^{-1})/I(800\ cm^{-1}) \leq 2.30 \qquad \text{Condition 1:}$$

in the above Condition 1, I (490 cm$^{-1}$) represents an intensity of a peak derived from a silica four-membered ring structure; and I (800 cm$^{-1}$) represents an intensity of a peak derived from a silica random network structure.

BRIEF DESCRIPTION OF DRAWINGS

FIG. 1 is a schematic diagram for describing an operation of abrasive grains with respect to an object to be polished.

DESCRIPTION OF EMBODIMENTS

A first aspect of the present invention is a method for producing a polishing composition, the method including: preparing silica satisfying the following Condition 1 when analyzed by Raman spectroscopy; and mixing the silica with a dispersing medium,

[Mathematical Formula 2]

$$I(490\ cm^{-1})/I(800\ cm^{-1}) \leq 2.30 \qquad \text{Condition 1:}$$

in the above Condition 1, I (490 cm$^{-1}$) represents an intensity of a peak derived from a silica four-membered ring structure; and I (800 cm$^{-1}$) represents an intensity of a peak derived from a silica random network structure.

The polishing composition obtained by such a production method can polish an object to be polished (particularly, an object to be polished containing oxygen atoms and silicon atoms) at a high polishing speed and can reduce scratches on a surface of the object to be polished.

In the related art, in semiconductor devices with an increasing number of stacked layers, there is a demand for development in a technique of polishing an interlayer insulating film (for example, a SiO$_2$ film) at a higher polishing speed. In general, a mechanical action of abrasive grains polishing an object to be polished is based on a mechanism as described below. That is, as illustrated in FIG. 1, the abrasive grains come close to the object to be polished (a) of FIG. 1). Then, by the abrasive grains moving on the object to be polished, the surface of the object to be polished is scraped (polished) (b) of FIG. 1), and finally, the abrasive grains are desorbed from the object to be polished (c) of FIG. 1). Of the above-described actions, in the related art, in order to achieve a high polishing speed, focusing on a step of the abrasive grains coming close to the object to be polished (a) of FIG. 1), it has been tried to promote polishing by the action of the abrasive grain by increasing the frequency of the abrasive grain coming close and/or contacting to the object to be polished. As a method of increasing of the frequency of the abrasive grain coming close and/or contacting to the object to be polished, for example, there have been proposed a method of increasing the number of abrasive grains, a method of increasing the size of abrasive grains, a method of using abrasive grains each having a different shape, a method of using abrasive grains having a zeta potential with a sign opposite to that of an object to be polished, a method of adding a salt to decrease absolute values of zeta potentials of abrasive grains and an object to be polished, and the like. However, in order to sufficiently meet a demand for a polishing speed higher than a polishing speed in the case of recent years and a demand for reduction of scratches (defects), there has been difficulty to fulfil the demands only by simply combining existing techniques as described above.

The present inventors have conducted intensive studies to solve the above-described problems. As a result, the present inventors have found that both a high polishing speed and reduction of scratches (defects) can be achieved using a polishing composition obtained by a production method including preparing silica in which a spectral pattern satisfies a predetermined requirement when analyzed by Raman spectroscopy, and mixing the silica with a dispersing medium. Although the technical scope of the present invention is not limited, a mechanism to be speculated will be described below.

Peaks appearing at 490 cm$^{-1}$ and 800 cm$^{-1}$ detected when silica is analyzed by Raman spectroscopy are derived from a silica four-membered ring structure and a silica random network structure, respectively. Therefore, a ratio (I (490 cm$^{-1}$)/I (800 cm$^{-1}$)) of an intensity of a peak appearing at 490 cm$^{-1}$ (I (490 cm$^{-1}$)) to an intensity of a peak appearing at 800 cm$^{-1}$ (I (800 cm$^{-1}$)) becomes an index of the presence ratio of the following four-membered ring structure included in the silica.

[Chem. 1]

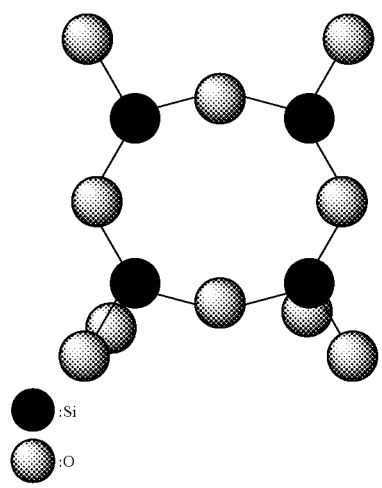

That is, Condition 1 in the present invention indicates that the presence ratio of the four-membered ring structure included in the silica is low. Such silica having a low presence ratio of the four-membered ring structure has small structural distortion so that the silica can be used as abrasive grains, which are less likely to be elastically deformed, in the polishing composition. In the production method according to the aspect of the present invention, when such abrasive grains, which are less likely to be elastically deformed, are used, a polishing composition to be produced is excellent in the polishing speed, and such an effect becomes significant particularly in a case where the concentration of the abrasive grains is low. Furthermore, the polishing composition produced by the production method according to the aspect of the present invention uses such abrasive grains which are less likely to be elastically deformed so that scratches present on the surface of the object to be polished can be efficiently scraped (removed), thereby suppressing defects. Moreover, both a high polishing speed and reduction of defects can be achieved. Further, the effect as described above can be exhibited with a low concentration of the silica so that a polishing composition can be produced at low cost.

Hereinafter, the present invention will be described in detail. Incidentally, unless otherwise specified, operations and measurements of a physical property or the like are carried out at conditions including room temperature (20 to 25° C.)/relative humidity of 40 to 50% RH.

The method for producing a polishing composition according to the aspect of the present invention includes preparing silica satisfying the above Condition 1 when analyzed by Raman spectroscopy. When silica used in the production of the polishing composition is such silica having a low presence ratio of a four-membered ring structure, both a high polishing speed and reduction of defects, particularly, both a high polishing speed and reduction of defects at a low concentration of abrasive grains can be achieved.

Analysis by Raman spectroscopy in the present specification is performed, specifically, by measurement by a method described in Examples. The silica used in the production method according to the aspect of the present invention is characterized in that, in the Raman spectrum obtained by the measurement method, a ratio (I (490 cm$^{-1}$)/I (800 cm$^{-1}$)) of an intensity of a peak appearing at 490 cm$^{-1}$ (I (490 cm$^{-1}$)) to an intensity of a peak appearing at 800 cm$^{-1}$ (I (800 cm$^{-1}$)) is 2.30 or less. The peak appearing at 490 cm$^{-1}$ is a peak derived from the silica four-membered ring structure, and the peak appearing at 800 cm$^{-1}$ is a peak derived from the silica random network structure. In silica in which the ratio of an intensity of a peak appearing at 490 cm$^{-1}$ (I (490 cm$^{-1}$)) to an intensity of a peak appearing at 800 cm$^{-1}$ (I (800 cm$^{-1}$)) is more than 2.30, structural distortion increases so that the silica is likely to be elastically deformed, and thus the polishing speed is decreased and defects are also likely to occur.

In the technical fields to which the present invention belongs, it is a common general technical knowledge that each peak detected in the Raman spectrum is slightly shifted between measurements even when peaks are derived from the same molecular structure. Also in the present specification, the "peak appearing at 490 cm$^{-1}$" and the "peak appearing at 800 cm$^{-1}$" may be a peak derived from the silica four-membered ring structure and a peak derived from the silica random network structure, respectively. More specifically, the "peak appearing at 490 cm$^{-1}$" means the maximum peak detected in a range of about 480 cm$^{-1}$ to about 500 cm$^{-1}$, and the "peak appearing at 800 cm$^{-1}$" means the maximum peak detected in a range of about 790 cm$^{-1}$ to about 810 cm$^{-1}$. Similarly, the "peak appearing at 980 cm$^{-1}$" means the maximum peak detected in a range of about 970 cm$^{-1}$ to about 990 cm$^{-1}$. Incidentally, in the present specification, the "peak intensity" means the height of the peak.

The silica used in the production method according to the aspect of the present invention may have a value of I (490 cm$^{-1}$)/I (800 cm$^{-1}$) of 2.30 or less as described above, preferably satisfies a relation of 1.20≤I (490 cm$^{-1}$)/I (800 cm$^{-1}$)≤2.30, more preferably satisfies a relation of 1.30≤I (490 cm$^{-1}$)/I (800 cm$^{-1}$)≤2.20, further preferably satisfies a relation of 1.40≤I (490 cm$^{-1}$)/I (800 cm$^{-1}$)≤2.10, and particularly preferably satisfies a relation of 1.50≤I (490 cm$^{-1}$)/I (800 cm$^{-1}$)≤2.00. With such a range, both the enhancement of polishing speed and reduction of scratches (defects) can be highly achieved.

In a preferable embodiment of the present invention, the silica used in the production of the polishing composition satisfies the following Condition 2 when analyzed by Raman spectroscopy,

[Mathematical Formula 3]

$$I(980\ cm^{-1})/I(800\ cm^{-1}) \leq 2.10 \qquad \text{Condition 2:}$$

Herein, in the above Condition 2, I (980 cm$^{-1}$) represents an intensity of a peak derived from a silanol group; and I (800 cm$^{-1}$) represents an intensity of a peak derived from a silica random network structure. By using silica satisfying such a condition, defects at the time of polishing are further suppressed. Although the technical scope of the present invention is not limited, a mechanism that is assumed to obtain such an effect will be described below using, as an example, the case of using water as the dispersing medium for the polishing composition.

A peak appearing at 980 cm$^{-1}$ is a peak derived from the silanol group of the silica. Therefore, a ratio (I (980 cm$^{-1}$)/I (800 cm$^{-1}$)) of an intensity of a peak appearing at 980 cm$^{-1}$ (I (980 cm$^{-1}$)) to an intensity of a peak appearing at 800 cm$^{-1}$ (I (800 cm$^{-1}$)) becomes an index of the presence ratio of the silanol group contained in the silica. Condition 2 in the present invention indicates that the presence ratio of the silanol group contained in the silica is low. In the silica having such a low presence ratio of the silanol group, it is considered that a solvent molecular film (water molecular film) formed on the surface of the silica is thinner than silica having a high presence ratio of the silanol group. In a case where such silica having a thin solvent molecular film (water molecular film) (that is, having a small bonded water content) is used as the polishing composition, since a distance between the silica and the object to be polished at the time of polishing is short, it is considered that affinity through a hydrogen bonding or the like between the silica and the object to be polished becomes stronger. Thus, it is considered that the time for desorbing the silica particles from the object to be polished becomes long, and as a result, a movement distance of the silica particles on the surface of the object to be polished becomes longer, so that the silica particles can scrape (remove) scratches present on the surface of the object to be polished during the moving thereof. In the case of using an object to be polished containing oxygen atoms and silicon atoms such as silicon oxide produced from a raw material such as tetraethylorthosilicate (TEOS), since it is understood that affinity between the silanol group on the surface of the silica and the object to be polished becomes particularly stronger, the effect as described above is understood to be exhibited particularly significantly in polishing of the object to be polished containing oxygen atoms and silicon atoms. In addition, when the amount of the silanol group present on the surface of the silica is small, the amount of the dispersing medium bonded with the silica through the silanol group also decreases. Thus, in a case where the above Condition 2 is satisfied, aggregation due to what the dispersing medium actively forms hydrogen-bonding with polishing scraps and the like can be suppressed, and scratches on the surface of the object to be polished after polishing can be reduced.

The silica used in the production method according to the aspect of the present invention satisfies the condition of 0.02≤I (980 cm$^{-1}$)/I (800 cm$^{-1}$)≤2.10 in a more preferable embodiment, satisfies the condition of 0.30≤I (980 cm$^{-1}$)/I (800 cm$^{-1}$)≤1.80 in a further preferable embodiment, satisfies the condition of 0.50≤I (980 cm$^{-1}$)/I (800 cm$^{-1}$)≤1.50 in a still more preferable embodiment, and satisfies the condition of 0.70≤I (980 cm$^{-1}$)/I (800 cm$^{-1}$)≤1.20 in a particularly preferable embodiment. With such a range, both the enhancement of polishing speed and reduction of scratches (defects) can be highly achieved.

The presence ratio of the four-membered ring structure of the silica and the presence ratio of the silanol group as described above can be controlled by a method for producing silica (such as an organosilicon compound, a reaction rate, a reaction temperature, and types of reaction catalysts).

In the production method of the present invention, it is essential to use silica (silica particles) as the abrasive grains and more preferable to use colloidal silica as the abrasive grains. That is, according to a preferable embodiment of the present invention, silica is colloidal silica. Examples of the method for producing colloidal silica include a soda silicate method, a sol-gel method, and the like, and colloidal silica produced by any of those methods is suitably used. However, from the viewpoint of reducing metal impurities, colloidal silica produced by a sol-gel method allowing production with high purity is preferable.

Herein, the shape of the silica (abrasive grains) is not particularly limited, but may be a spherical shape or a non-spherical shape, and a spherical shape is preferable.

The size of the silica (abrasive grains) is not particularly limited. For example, the average primary particle size of the silica (abrasive grains) is preferably 5 nm or more, more preferably 10 nm or more, further preferably 20 nm or more. As the average primary particle size of the silica increases, the polishing speed of the object to be polished by the polishing composition is enhanced. In addition, the average primary particle size of the silica is preferably 200 nm or less, more preferably 100 nm or less, and further preferably 50 nm or less. As the average primary particle size of the silica decreases, it is easy to obtain a surface with fewer defects and a small roughness by polishing using the polishing composition. The average primary particle size of the silica (abrasive grains) is 5 nm to 200 nm in a preferable embodiment, 10 nm to 100 nm in a more preferable embodiment, and 20 nm to 50 nm in a particularly preferable embodiment. Incidentally, the average primary particle size of the silica (the diameter of the silica particles (primary particles)) can be calculated, for example, on the basis of the specific surface area of the silica particles calculated by the BET method on the assumption that the shape of the silica particles is true spherical. In the present specification, a value measured by a method described in the following Examples is employed as the average primary particle size of the silica.

Further, the average secondary particle size of the silica (abrasive grains) is preferably 25 nm or more, more preferably 35 nm or more, and further preferably 55 nm or more. As the average secondary particle size of the silica increases, the polishing resistance of a polishing device during polishing decreases, and thus polishing can be stably performed. In addition, the average secondary particle size of the silica is preferably 1 μm or less, more preferably 500 nm or less, and further preferably 100 nm or less. As the average secondary particle size of the silica decreases, the surface area per unit mass of the silica increases, the frequency of contact to the object to be polished is improved, and the polishing efficiency is improved. The average secondary particle size of the silica (abrasive grains) is 25 nm to 1 µm in a preferable embodiment, 35 nm to 500 nm in a more preferable embodiment, and 55 nm to 100 nm in a particularly preferable embodiment. In the present specification, a value measured by a method described in the following Examples is employed as the average secondary particle size of the silica. Incidentally, values of the degree of association (the average secondary particle size/the average primary particle size) calculated from those values are also not particularly limited, and for example, are 1.5 to 5.0 and preferably about 1.8 to 4.0.

For example, the density of the silica (abrasive grains) also varies depending on a method for producing silica (for example, a sol-gel method, a soda silicate method, or the like). In addition, even in the case of employing one production method (for example, a sol-gel method), the porosity changes due to a temperature, a time for reaction, or the like. Since the porosity of the silica is considered to affect the hardness of the silica itself, it is preferable to figure out the true density. Herein, in consideration of the hardness of the silica, the true density of the silica (abrasive grains) is preferably more than 1.70 g/cm$^3$, more preferably 1.80 g/cm$^3$ or more, further preferably 1.90 g/cm$^3$ or more, and particularly preferably 2.07 g/cm$^3$ or more. According to a more preferable embodiment of the present invention, the silica has a true density of 1.90 g/cm$^3$ or more. According to a particularly preferable embodiment of the present invention, the silica has a true density of 2.07 g/cm$^3$ or more. In addition, the upper limit of the true density of the silica is preferably 2.20 g/cm$^3$ or less, more preferably 2.18 g/cm$^3$ or less, and particularly preferably 2.15 g/cm$^3$ or less. The true density of the silica (abrasive grains) is more than 1.70 g/cm$^3$ and 2.20 g/cm$^3$ or less in a preferable embodiment, 1.80 g/cm$^3$ to 2.18 g/cm$^3$ in a more preferable embodiment, 1.90 g/cm$^3$ to 2.15 g/cm$^3$ in a still more preferable embodiment, and 2.07 g/cm$^3$ to 2.15 g/cm$^3$ in a particularly preferable embodiment. In the present specification, a value measured by a method described in the following Examples is employed as the true density of the silica (abrasive grains).

Furthermore, the silica may be surface-modified. In the case of the surface-modified silica as the abrasive grains, colloidal silica with organic acid or organic amine immobilized thereto is preferably used. Such immobilization of the organic acid or organic amine to surfaces of the colloidal silica contained in the polishing composition is made by, for example, chemically bonding functional groups of the organic acid or the organic amine with the surfaces of the colloidal silica. The organic acid or the organic amine is not immobilized to the colloidal silica just by allowing the colloidal silica and the organic acid or the organic amine to coexist. If immobilizing sulfonic acid that is a kind of such organic acid to the colloidal silica, for example, a method described in "Sulfonic acid-functionalized silica through quantitative oxidation of thiol groups," Chem. Commun. 246-247 (2003) can be adopted. Specifically, by coupling a silane coupling agent having thiol groups such as 3-mercaptopropyltrimethoxysilane with the colloidal silica, and subsequently oxidizing the thiol groups with hydrogen peroxide, the colloidal silica with the sulfonic acid immobilized to the surface thereof can be obtained. Alternatively, if immobilizing carboxylic acid to the colloidal silica, for example, a method described in "Novel Silane Coupling Agents Containing a Photolabile 2-Nitrobenzyl Ester for Introduction of a Carboxy Group on the Surface of Silica Gel," Chemistry Letters, 3, 228-229 (2000) can be adopted. Specifically, by coupling a silane coupling agent containing photolabile 2-nitrobenzyl ester with the colloidal silica and subsequently irradiating the colloidal silica with light, the colloidal silica with carboxylic acid immobilized to the surface thereof can be obtained. If immobilizing alkylamine that is a kind of such organic amine to the colloidal silica, a method described in JP 2012-211080 A (the specification of US 2010/071272 A) can be adopted. Specifically, by coupling a silane coupling agent containing alkylamine groups such as 3-aminopropyltriethoxysilane with the colloidal silica, the colloidal silica with the organic amine immobilized to the surface thereof can be obtained.

The size (the average primary particle size, the average secondary particle size) and the true density of the silica can be appropriately controlled by selecting a method for producing silica (abrasive grains), or the like.

The polishing composition contains silica as the abrasive grains. When the content of the silica in the polishing composition is large, the polishing speed tends to increase, and when the content thereof is small, defects tends to be suppressed. As described above, in the polishing composition of the present invention, even in the case of a small amount (low concentration) of the silica, the silica efficiently comes close to the object to be polished, so that the surface of the object to be polished can be efficiently polished. Although the technical scope of the present invention is not limited, when the content of the silica is equal to or more than a certain amount, the object to be polished is prevented from being directly polished with a polishing pad, so that occurrence of defects can be effectively prevented. Specifically, the content (concentration) of the silica is preferably 0.01% by mass to 5% by mass with respect to the total amount of the polishing composition. From the viewpoint that both the enhancement of the polishing speed and reduction of scratches (defects) can be achieved in a good balance while the cost is suppressed, the content (concentration) of the silica is more preferably 0.1% by mass to 3% by mass, further preferably 0.2% by mass to 2% by mass, and particularly preferably 0.5% by mass to 1% by mass with respect to the total amount of the polishing composition. Incidentally, in a case where the polishing composition contains two or more kinds of silica, the content of the silica means the total amount thereof.

The production method according to the aspect of the present invention includes mixing the silica as described above with a dispersing medium. Examples of the dispersing medium may include water; alcohols such as methanol, ethanol, and ethylene glycol; ketones such as acetone; and a mixture thereof, but it is preferable to include water. That is, according to a preferable embodiment of the present invention, the dispersing medium includes water. According to a more preferable embodiment of the present invention, the dispersing medium substantively consists of water. Incidentally, the term "substantively" is intended to mean that a dispersing medium other than water may be included as long as the objective effect of the present invention can be achieved, and more specifically, the dispersing medium include 90% by mass to 100% by mass of water and 0% by mass to 10% by mass of a dispersing medium other than water, and preferably includes 99% by mass to 100% by mass of water and 0% by mass to 1% by mass of a dispersing medium other than water. Most preferably, the dispersing medium is water. From the viewpoint of suppressing interference with the action of other components, water not containing impurities as much as possible is preferable, and specifically, pure water, ultrapure water, or distilled water obtained by removing impurity ions with an ion exchange resin and removing foreign substance with filtration of a filter is preferable.

The method for mixing the abrasive grains (silica) and the dispersing medium is not particularly limited, but for example, the polishing composition can be obtained by stirring and mixing the abrasive grains and, if necessary, other components (for example, an oxidizing agent, a metal anticorrosive, an antiseptic agent, an antifungal agent, and the like described later) in the dispersing medium. The temperature for mixing each component in the composition is not particularly limited, but is preferably 10 to 40° C., and it may perform heating to increase the rate of dissolution. Further, the mixing time is also not particularly limited.

Regarding the pH of the polishing composition, the pH at 25° C. is preferably less than 6.0. When the pH of the polishing composition at 25° C. is less than 6.0, the polishing speed is further enhanced. That is, in a preferable embodiment of the present invention, the method for producing a polishing composition includes adjusting a pH of a mixed liquid after mixed with silica to less than 6.0. The pH of the polishing composition at 25° C. is preferably 5.0 or less and particularly preferably 4.0 or less. The lower limit of the pH of the polishing composition at 25° C. is preferably 1.0 or more, more preferably 2.0 or more, and particularly preferably 3.0 or more. Incidentally, in the present specification, unless otherwise specified, "pH" means "pH at 25° C." The pH of the polishing composition at 25° C. is preferably 1.0 or more and less than 6.0 in a preferable embodiment, 2.0 or more and less than 6.0 in a more preferable embodiment, 3.0 or more and less than 6.0 in a further preferable embodiment, and 3.0 to 4.0 in a particularly preferable embodiment. With such a pH of the polishing composition, silica (abrasive grains) can be stably dispersed. In the present specification, a value measured at 25° C. by a pH meter (model number: LAQUA, manufactured by HORIBA, Ltd.) is employed as the pH.

The pH can be adjusted by adding an appropriate amount of a pH adjusting agent. That is, the polishing composition may further contain a pH adjusting agent. Herein, the pH adjusting agent, which is used as necessary for adjusting the pH of the polishing composition to a desired value, may be either acid or alkali, and may be either an inorganic compound or an organic compound. Specific examples of the acid include inorganic acids such as sulfuric acid, nitric acid, boric acid, carbonic acid, hypophosphorous acid, phosphorus acid, and phosphoric acid; and organic acids including: carboxylic acid such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; organic sulfuric acid such as methanesulfonic acid, ethanesulfonic acid, and isethionic acid; and organic phosphorus-based acid such as phytic acid and hydroxyethylidene diphosphonic acid. The pH is preferably adjusted using one or more kinds selected from the group consisting of sulfuric acid, acetic acid, and lactic acid of the above-described acids, and the pH is more preferably adjusted using acetic acid or sulfuric acid.

Specific examples of the alkali include hydroxides of alkali metal such as potassium hydroxide, amines such as ammonia, ethylenediamine, and piperazine, and quaternary ammonium salts such as tetramethylammonium and tetraethylammonium. These pH adjusting agents can be used alone or as a mixture of two or more kinds thereof.

In the method for producing a polishing composition according to the aspect of the present invention, other components such as an oxidizing agent, a metal anticorrosive, an antiseptic agent, an antifungal agent, a water-soluble polymer, and an organic solvent for dissolving an insoluble organic matter may be further contained in the dispersing medium as necessary. The oxidizing agent, the metal anticorrosive, the antiseptic agent, and the antifungal agent as preferable other components will be described below.

(Oxidizing Agent)

The oxidizing agent that can be added to the polishing composition has an effect for oxidizing the surface of the object to be polished so as to enhance the polishing speed of the object to be polished by the polishing composition.

Examples of the usable oxidizing agent include hydrogen peroxide, sodium peroxide, barium peroxide, ozone water, silver(II) salts, iron(III) salts, permanganic acid, chromic acid, dichromic acid, peroxodisulfuric acid, peroxophosphoric acid, peroxosulfuric acid, peroxyboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, salts thereof, and the like. These oxidizing agents may be used alone or as a mixture of two or more kinds thereof.

The content of the oxidizing agent in the polishing composition is preferably 0.1 g/L or more, more preferably 1 g/L or more, and further preferably 3 g/L or more. As the content of the oxidizing agent increases, the polishing speed of the object to be polished by the polishing composition is further enhanced.

The content of the oxidizing agent in the polishing composition is preferably 200 g/L or less, more preferably 100 g/L or less, and further preferably 40 g/L or less. As the content of the oxidizing agent decreases, the material cost of the polishing composition can be suppressed and a treatment of the polishing composition after being used for the polishing, that is, a load on a waste water treatment can be reduced. Further, possibility that the surface of the object to be polished is excessively oxidized by the oxidizing agent can also be reduced.

(Metal Anticorrosive)

Addition of the metal anticorrosive into the polishing composition can suppress generation of a hollow on a side of a wiring formed by polishing using the polishing composition. Further, the addition of the metal anticorrosive can also suppress generation of dishing on the surface of the object to be polished after being polished using the polishing composition.

The usable metal anticorrosive is not particularly limited, but is preferably a heterocyclic compound or a surfactant. The number of heterocyclic rings in the heterocyclic compound is not particularly limited. Further, the heterocyclic compound may be a monocyclic compound or a polycyclic compound having a fused ring. The metal anticorrosive may be used alone or as a mixture of two or more kinds thereof. Further, a commercial product or a synthetic product may be used as the metal anticorrosive.

Specific examples of the heterocyclic compound that can be used as the metal anticorrosive include nitrogen-containing heterocyclic compounds such as a pyrrolic compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buterizine compound, a thiazole compound, an isothiazole compound, an oxazole compound, an isoxazole compound, and a furazan compound.

(Antiseptic Agent and Antifungal Agent)

Examples of the antiseptic agent and the antifungal agent used in the present invention include isothiazolin-based antiseptic agents such as 2-methyl-4-isothiazolin-3-one and 5-chloro-2-methyl-4-isothiazolin-3-one; paraoxybenzoic acid esters; phenoxyethanol; and the like. These antiseptic agents and antifungal agents may be used alone or as a mixture of two or more kinds thereof.

In the present invention, the object to be polished is not particularly limited, but examples thereof include a metal, an object to be polished which has oxygen atoms and silicon atoms, an object to be polished which has a silicon-silicon bond, and an object to be polished which has nitrogen atoms and silicon atoms.

Examples of the metal include copper, aluminum, hafnium, cobalt, nickel, titanium, tungsten, and the like.

Examples of the object to be polished which has oxygen atoms and silicon atoms include silicon oxide ($SiO_2$), a hydrolysis condensate of tetraethylorthosilicate (TEOS), and the like.

Examples of the object to be polished which has a silicon-silicon bond include polysilicon, amorphous silicon, monocrystalline silicon, n-type doped monocrystalline silicon, p-type doped monocrystalline silicon, and a Si-based alloy such as SiGe.

Examples of the object to be polished which has nitrogen atoms and silicon atoms include a silicon nitride film and an object to be polished which has a silicon-nitrogen bond such as silicon carbonitride (SiCN).

These materials may be used alone or in combination of two or more kinds thereof.

Among them, in the case of an object to be polished containing oxygen atoms and silicon atoms, further, in the case of an object to be polished containing a bond of oxygen atoms and silicon atoms, the effect of the present invention can be effectively exhibited. Further, in the case of an object to be polished containing silicon oxide using tetraethylorthosilicate (TEOS) as a raw material, the effect of the present invention can be further effectively exhibited. That is, according to a preferable embodiment of the present invention, the polishing composition is used for polishing an object to be polished containing oxygen atoms and silicon atoms. Therefore, the aspect of the present invention provides a polishing method including: producing a polishing composition by the above-described production method; and polishing an object to be polished containing oxygen atoms and silicon atoms using the polishing composition. Further, according to a particularly preferable embodiment of the present invention, an object to be polished is a silicon oxide substrate using tetraethylorthosilicate as a raw material.

Incidentally, the object to be polished is preferably a material containing oxygen atoms and silicon atoms, but even in this case, may contain other materials than the above-described materials. Examples of the other materials include silicon nitride (SiN), silicon carbide (SiC), sapphire ($Al_2O_3$), and silicon-germanium (SiGe).

As a polishing device, it is possible to use a general polishing device provided with a holder for holding a substrate or the like having an object to be polished, a motor or the like having a changeable rotation speed, and a polishing table to which a polishing pad (polishing cloth) can be attached.

As the polishing pad, a general nonwoven fabric, polyurethane, a porous fluororesin, or the like can be used without any particular limitation. The polishing pad is preferably groove-processed such that a polishing liquid can be stored therein.

Polishing conditions are not also particularly limited, but for example, the rotation speed of the polishing table (platen) is preferably 10 to 500 rpm and the pressure (polishing pressure) applied to a substrate having an object to be polished is preferably 0.5 to 10 psi. A method for supplying the polishing composition to a polishing pad is not also particularly limited, but for example, a method in which the polishing composition is supplied continuously using a pump or the like is employed. The supply amount thereof is not limited, but a surface of the polishing pad is preferably covered all the time with the polishing composition according to the aspect of the present invention.

After completing the polishing, the substrate is washed in flowing water, and is dried by shaking off water drops that are attached to the substrate by a spin drier or the like, thereby obtaining the substrate containing oxygen atoms and silicon atoms.

In a second aspect of the present invention, there is provided a polishing composition containing silica satisfying the above Condition 1 when analyzed by Raman spectroscopy and a dispersing medium. In a preferable embodiment, the silica satisfies the above Condition 2 when analyzed by Raman spectroscopy. Incidentally, in the second aspect of the present invention, the contents described in the first aspect are appropriately modified and applied.

The polishing composition of the present invention may be a one-component type or a multi-component type including a two-component type in which a part or a whole of the polishing composition is mixed at an arbitrary mixing ratio. Further, in the case of using a polishing device having a plurality of supply paths for the polishing composition, two or more polishing compositions prepared in advance may be used so that the polishing compositions can be mixed on the polishing device.

Further, the polishing composition according to the aspect of the present invention may be an undiluted solution, or may be prepared by diluting an undiluted solution of a polishing composition with water. In a case where the polishing composition is the two-component type, an order of mixing and diluting is arbitrary, and examples thereof include: diluting one of the compositions with water and then mixing the compositions together; diluting the compositions with water simultaneously with mixing; diluting the mixed polishing compositions with water; and the like.

EXAMPLES

The present invention will be described in more detail by means of the following Examples and Comparative Examples. However, the technical scope of the present invention is not limited only to the following Examples. Incidentally, unless otherwise specified, "%" and "part(s)" respectively mean "% by mass" and "part(s) by mass." Further, in the following Examples, unless otherwise specified, operations were carried out under conditions at room temperature (25° C.)/relative humidity of 40 to 50% RH.

Incidentally, the average primary particle size (nm), the average secondary particle size (nm), the true density (g/cm³), and the intensity of the peak detected by Raman spectroscopy were measured by the following methods.

[Average Particle Size (nm) of Silica]

The average primary particle size (nm) of the silica (abrasive grains) is calculated on the basis of the specific surface area of the silica particles of 0.2 g of a silica sample calculated by the BET method on the assumption that the shape of the silica particles is true spherical. Incidentally, a value of the degree of association (the average secondary particle size/the average primary particle size) can also be calculated from those values.

The average secondary particle size (nm) of the silica (abrasive grains) was measured with respect to a silica sample as a volume average particle size by a dynamic light scattering method using a dynamic light scattering type particle size distribution measuring apparatus (UPA-UT151, manufactured by NIKKISO CO., LTD. First, the abrasive grains were dispersed in pure water to prepare a dispersion liquid having a loading index (scattering intensity of laser light) of 0.01. Subsequently, the value of the volume average particle size My at UT mode was continuously measured using the dispersion liquid 3 to 5 times, and then an average value of the obtained values was regarded as the average secondary particle size.

[True Density (g/cm³) of Silica]

The true density (g/cm³) of the silica (abrasive grains) is measured by the following method. Specifically, first, an aqueous solution of silica is put into a crucible to be an amount of about 15 g as the solid content (silica), and moisture is evaporated at about 200° C. using a commercially available hot plate. Further, in order to also remove moisture remaining in the pores of the silica, a thermal treatment is performed at 300° C. for 1 hour using an electric furnace (manufactured by Advantech Co., Ltd., firing furnace) and dry silica after the treatment is ground with a mortar. Subsequently, 10 g of the dry silica produced above is put into a 100-ml pycnometer (Wa (g)) of which a weight is measured with a microbalance (manufactured by A&D Company, Limited, GH-202) in advance, the weight is measured (Wb (g)), and then degassing is performed for 30 minutes in a depressurized desiccator by adding 20 ml of ethanol. Thereafter, ethanol is filled in the pycnometer, the pycnometer is sealed with a stopper, and then the weight is measured (Wc (g)). The contents of the pycnometer in which the weight measurement of the silica is completed are discarded, ethanol is filled in the pycnometer after washing, and then the weight is measured (Wd (g)). The true density is calculated by Formula 1 and Formula 2 from those weights and the temperature (t (° C.)) of ethanol at the time of measurement.

[Mathematical Formula 4]

$$Ld = 0.80653 - 0.000867 \times t \quad \text{Formula 1:}$$

In the above Formula 1, Ld represents the specific weight (g/cm³) of ethanol at t° C.

[Mathematical Formula 5]

$$Sg = (Wb - Wa)/(Wd - Wc + Wb - Wa) \times Ld \quad \text{Formula 2:}$$

In the above Formula 2, Sg represents the true density (g/cm³) of the silica;

Wa represents the weight (g) of the pycnometer;

Wb represents the total weight (g) of the sample (dry silica) and the pycnometer;

Wc represents the total weight (g) of the sample (dry silica), ethanol, and the pycnometer;

Wd represents the total weight (g) of ethanol and the pycnometer; and

Ld represents the specific weight (g/cm³) of ethanol obtained in the above Formula 1.

[Raman Spectroscopy]

2 to 3 ml of dispersion liquid prepared to have a silica concentration of 20% by mass was put into a sample holder of a Raman spectrometer, and measurement was performed under conditions presented in the following Table 1. Ramanar T-64000 (manufactured by Jobin yvon Inc.) was used in the measurement by Raman spectroscopy. The base line of the result obtained by the measurement was corrected according to the ordinary method to obtain a Raman spectrum, and a ratio (I (490 cm$^{-1}$)/I (800 cm$^{-1}$)) of a peak intensity at 490 cm$^{-1}$ derived from the four-membered ring structure of silica (I (490 cm$^{-1}$)) to a peak intensity at 800 cm$^{-1}$ derived from the random network structure (I (800 cm$^{-1}$)) and a ratio (980 cm$^{-1}$)/I (800 cm$^{-1}$)) of a peak intensity at 980 cm$^{-1}$ derived from the silanol group of silica (I (980 cm$^{-1}$)) to a peak intensity at 800 cm$^{-1}$ derived from the random network structure (I (800 cm$^{-1}$)) were calculated, respectively.

TABLE 1

| Apparatus | Ramanar T-64000 (Jobin Yvon/ATAGO BUSSAN Co., Ltd. |
|---|---|
| Measurement mode | Macro Raman |
| Measurement arrangement | 180° scattering |
| Beam diameter | 100 μm |
| Light source | Ar + laser/514.5 nm |
| Laser power | 200 mW |
| Diffraction lattice | Spectrograph 600 gr/mm |
| Dispersion | Single 21 A/mm |
| Slit | 100 μm |
| Detector | CCD/Jobin Yvon 1024 × 256 |
| Sample amount | 2 to 3 ml |

Example 1

As the abrasive grains, abrasive grains 1 were prepared. The abrasive grains 1 are colloidal silica, which is produced by a sol-gel method, having an average primary particle size of 32 nm, an average secondary particle size of 61 nm, a degree of association of 1.9, and a true density of 2.10 g/cm³. Incidentally, when the abrasive grains 1 were analyzed by Raman spectroscopy, I (490 cm$^{-1}$) was 74.8, I (800 cm$^{-1}$) was 40.8, and I (980 cm$^{-1}$) was 40.4.

The above-described abrasive grains 1 were stirred and dispersed into a dispersing medium (pure water) so that the concentration of the abrasive grains 1 in the composition would be 1% by mass, and sulfuric acid as a pH adjusting agent was added so that the pH of the mixed liquid (dispersion liquid) would be 4.0, thereby producing a polishing composition (polishing composition 1) (mixing temperature: about 25° C., mixing time: about 10 minutes). Incidentally, the pH of the polishing composition (liquid temperature: 25° C.) was checked by a pH meter (model number: LAQUA, manufactured by HORIBA, Ltd.).

Example 2

A polishing composition (polishing composition 2) was produced in a similar manner to Example 1, except that, in Example 1, the concentration of abrasive grains in the composition was set to 0.5% by mass.

Example 3

A polishing composition (polishing composition 3) was produced in a similar manner to Example 1, except that, in Example 1, the concentration of abrasive grains in the composition was set to 0.1% by mass.

Example 4

A polishing composition (polishing composition 4) was produced in a similar manner to Example 1, except that, in Example 1, the concentration of abrasive grains in the composition was set to 3.0% by mass.

Example 5

A polishing composition (polishing composition 5) was produced in a similar manner to Example 1, except that, in Example 1, acetic acid was used as the pH adjusting agent.

Example 6

A polishing composition (polishing composition 6) was produced in a similar manner to Example 1, except that, in Example 1, lactic acid was used as the pH adjusting agent.

Example 7

As the abrasive grains, abrasive grains 2 were prepared. The abrasive grains 2 were colloidal silica, which is produced by a sol-gel method, having an average primary particle size of 30 nm, an average secondary particle size of 62 nm, a degree of association of 2.1, and a true density of 2.05 g/cm$^3$. Incidentally, when the abrasive grains 2 were analyzed by Raman spectroscopy, I (490 cm$^{-1}$) was 70.8, I (800 cm$^{-1}$) was 35.2, and I (980 cm$^{-1}$) was 42.6.

The above-described abrasive grains 2 were stirred and dispersed into a dispersing medium (pure water) so that the concentration of the abrasive grains 2 in the composition would be 1% by mass, and lactic acid as a pH adjusting agent was added so that the pH of the mixed liquid (dispersion liquid) would be 4.0, thereby producing a polishing composition (polishing composition 7) (mixing temperature: about 25° C., mixing time: about 10 minutes). Incidentally, the pH of the polishing composition (liquid temperature: 25° C.) was checked by a pH meter (model number: LAQUA, manufactured by HORIBA, Ltd.).

Comparative Example 1

As the abrasive grains, abrasive grains 3 were prepared. The abrasive grains 3 were colloidal silica, which is produced by a sol-gel method, having an average primary particle size of 35 nm, an average secondary particle size of 67 nm, a degree of association of 1.9, and a true density of 1.80 g/cm$^3$. Incidentally, when the abrasive grains 3 were analyzed by Raman spectroscopy, I (490 cm$^{-1}$) was 62.0, I (800 cm$^{-1}$) was 23.7, and I (980 cm$^{-1}$) was 51.6.

The above-described abrasive grains 3 were stirred and dispersed into a dispersing medium (pure water) so that the concentration of the abrasive grains 3 in the composition would be 1% by mass, and sulfuric acid as a pH adjusting agent was added so that the pH of the mixed liquid (dispersion liquid) would be 4.0, thereby producing a polishing composition (polishing composition 7) (mixing temperature: about 25° C., mixing time: about 10 minutes). Incidentally, the pH of the polishing composition (liquid temperature: 25° C.) was checked by a pH meter (model number: LAQUA, manufactured by HORIBA, Ltd.).

Comparative Example 2

A polishing composition (polishing composition 8) was produced in the same manner as in Comparative Example 1, except that the pH of the mixed liquid (dispersion liquid) was adjusted to 6.0 in Comparative Example 1.

[Polishing Speed]

The polishing speed (TEOS RR) when the object to be polished (a silicon oxide substrate using TEOS as a raw material; hereinafter, also referred to as "silicon oxide substrate") was polished using each of the polishing compositions obtained above was measured.

(Polishing Condition)

Polishing device: small tabletop polishing device (manufactured by Engis Japan Corporation, EJ380IN)

Polishing pad: rigid polyurethane pad (manufactured by Nitta Haas Incorporated, IC1000)

Number of rotations of platen (table): 60 [rpm]

Number of rotations of head (carrier): 60 [rpm]

Polishing pressure: 3.0 [psi]

Flow rate of polishing composition (slurry): 100 [ml/min]

Polishing time: 1 [min]

The polishing speed (polishing rate) was evaluated by obtaining film thicknesses of the object to be polished before and after polishing by a light interference type film thickness measurement apparatus (manufactured by SCREEN Holdings Co., Ltd., Lambda Ace VM2030) and dividing a difference between the film thicknesses by the polishing time (see a below formula).

$$\text{Polishing rate [Å/min]} = \frac{\text{Film thickness before polishing [Å]} - \text{Film thickness after polishing [Å]}}{\text{Polishing time [min]}} \quad \text{[Mathematical Formula 6]}$$

[Defects (Scratches)]

Defects (scratches) were evaluated using each of the polishing compositions obtained above according to the following method. Specifically, the number of scratches on a surface of the object to be polished was obtained by detecting defects of 0.13 μm or more on a whole surface of a wafer (however, excluding an area within 2 mm from its outer periphery) using a defect detection device (wafer surface inspection device) "Surfscan SP2" manufactured by KLA-Tencor 2 (KLA-TENCOR) Corporation. All of the detected defects were observed by a Review-SEM (RS-6000, manufactured by Hitachi High-Technologies Corporation) and then the number of the defects (scratches) was summed. The number of the obtained defects (scratches) was evaluated according to the following determination criteria.

(Defect Determination Criteria)

⊙: The number of defects of 0.1 μm or more is 20 or less.

○: The number of defects of 0.1 μm or more is 21 to 29.

Δ: The number of defects of 0.1 μm or more is 30 to 50.

×: The number of defects of 0.1 μm or more is 50 or more.

TABLE 2

| | Primary particle size (nm) | Secondary particle size (nm) | True density (g/cm$^3$) | I (490 cm$^{-1}$)/I (800 cm$^{-1}$) | I (980$^{-1}$)/I (800 cm$^{-1}$) | Abrasive grain concentration (% by mass) | pH adjusting agent | pH | Polishing rate (Å/min) | Defect |
|---|---|---|---|---|---|---|---|---|---|---|
| Example 1 | 32 | 61 | 2.10 | 1.83 | 0.99 | 1 | Sulfuric acid | 4.0 | 1555 | ☉ |
| Example 2 | 32 | 61 | 2.10 | 1.83 | 0.99 | 0.5 | Sulfuric acid | 4.0 | 1433 | ☉ |
| Example 3 | 32 | 61 | 2.10 | 1.83 | 0.99 | 0.1 | Sulfuric acid | 4.0 | 614 | ○ |
| Example 4 | 32 | 61 | 2.10 | 1.83 | 0.99 | 3 | Sulfuric acid | 4.0 | 1763 | ○ |
| Example 5 | 32 | 61 | 2.10 | 1.83 | 0.99 | 1 | Acetic acid | 4.0 | 1578 | ☉ |
| Example 6 | 32 | 61 | 2.10 | 1.83 | 0.99 | 1 | Lactic acid | 4.0 | 1512 | ☉ |
| Example 7 | 30 | 62 | 2.05 | 2.01 | 1.21 | 1 | Lactic acid | 4.0 | 696 | Δ |
| Comparative Example 1 | 35 | 67 | 1.80 | 2.62 | 2.18 | 1 | Sulfuric acid | 4.0 | 83 | X |
| Comparative Example 2 | 35 | 67 | 1.80 | 2.62 | 2.18 | 1 | Sulfuric acid | 6.0 | 13 | X |

As clearly shown from the above Table 2, it is found that the polishing compositions of Examples further enhance the polishing speed of the silicon oxide substrate and can reduce scratches on the surface of the silicon oxide substrate even when the polishing compositions have a low concentration of the silica concentration of 0.1 to 3.0% by mass.

Incidentally, the present application is based on the Japanese patent application No. 2016-140568 filed on Jul. 15, 2016, and a disclosed content thereof is incorporated herein as a whole by reference.

The invention claimed is:

1. A method for producing a polishing composition, the method comprising:
    selecting silica on the basis that it satisfies the following intensity ratio of Condition 1 when analyzed by Raman spectroscopy; and
    mixing the silica with a dispersing medium and a pH adjusting agent to adjust a pH at 25° C. to 4.0 or more and less than 6.0, $I(490 \text{ cm}^{-1})/I(800 \text{ cm}^{-1}) \leq 2.30$  Condition 1 wherein I (490 cm') represents an intensity of a peak derived from a silica four-membered ring structure, and I (800 cm$^{-1}$) represents an intensity of a peak derived from a silica random network structure.

2. The production method according to claim 1, wherein the silica satisfies the following Condition 2 when analyzed by Raman spectroscopy, $I(980 \text{ cm}^{-1})/I(800 \text{ cm}^{-1}) \leq 2.10$  Condition 2 wherein I (980 cm$^{-1}$) represents an intensity of a peak derived from a silanol group and I (800 cm$^{-1}$) represents an intensity of a peak derived from a silica random network structure.

3. The production method according to claim 1, wherein a content of the silica is 0.01% by mass or more and 5% by mass or less with respect to the total amount of the composition.

4. The production method according to claim 1, wherein the silica is colloidal silica.

5. The production method according to claim 1, wherein the dispersing medium includes water.

6. The production method according to claim 1, wherein the silica has a true density of 1.90 g/cm$^3$ or more.

7. The production method according to claim 1, wherein the pH adjusting agent is acetic acid or sulfuric acid.

8. A polishing method comprising: producing a polishing composition by the method set forth in claim 1; and polishing an object to be polished containing oxygen atoms and silicon atoms using the polishing composition.

* * * * *